United States Patent [19]

Takahama

[11] Patent Number: 5,038,194
[45] Date of Patent: Aug. 6, 1991

[54] SEMICONDUCTOR DEVICE

[76] Inventor: Shinobu Takahama, c/o Mitsubishi Denki Kabushiki Kaisha, Kitaitami Seisakusho, No. 1, Mizuhara 4-chome, Itami-shi, Hyogo-ken, Japan

[21] Appl. No.: 67,388

[22] Filed: Jun. 26, 1987

Related U.S. Application Data

[63] Continuation of Ser. No. 728,863, Apr. 30, 1985, abandoned.

[30] Foreign Application Priority Data

May 11, 1984 [JP] Japan ................................ 59-95113

[51] Int. Cl.$^5$ ..................... H01L 23/12; H01L 23/14; H01L 23/48
[52] U.S. Cl. ......................................... 357/68; 357/71; 357/62
[58] Field of Search ..................... 357/71, 67, 174, 80, 357/81, 68

[56] References Cited

U.S. PATENT DOCUMENTS

| | | | |
|---|---|---|---|
| 4,021,839 | 5/1977 | Denlinger | 357/81 |
| 4,047,197 | 9/1977 | Schierz | 357/75 |
| 4,458,305 | 7/1984 | Buckle et al. | |
| 4,510,677 | 4/1985 | Collumeau | 357/72 |
| 4,514,587 | 4/1985 | Van Dyk Soerewyn | 357/74 |
| 4,518,982 | 5/1985 | Du Bois et al. | 357/68 |
| 4,538,170 | 8/1985 | Yerman | 357/68 |
| 4,556,899 | 12/1985 | Kurihara et al. | 357/67 |
| 4,558,510 | 12/1985 | Tani et al. | 357/72 |

Primary Examiner—Rolf Hille
Assistant Examiner—S. V. Clark

[57] ABSTRACT

A semiconductor device, which includes: an insulating substrate; a semiconductor element for supplying or cutting off electric power, the element being mounted on the substrate; an electric power terminal mounted on the substrate; a conductivity layer for connecting the semiconductor element and the electric power terminal, the conductivity layer being pattern wired on the substrate by gilding or vapor-plating; and a conductor provided on the conductivity layer.

13 Claims, 3 Drawing Sheets

F I G. 5(a)
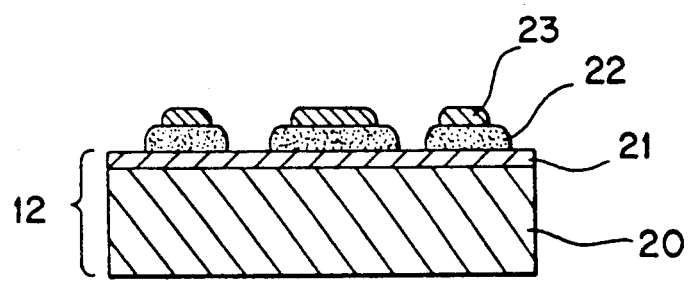
F I G. 5(b)
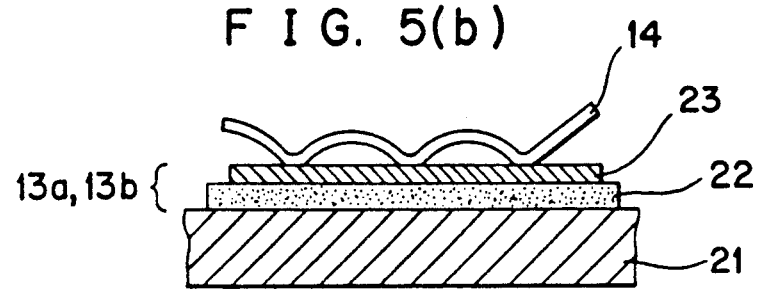

SEMICONDUCTOR DEVICE

This application is a continuation of application Ser. No. 728,863 filed on Apr. 30, 1985, now abandoned.

FIELD OF THE INVENTION

The present invention relates to a semiconductor device, and more particularly to the miniaturization and the enhancement of the integration density in a semiconductor power module for use in an electronic apparatus.

BACKGROUND OF THE INVENTION

Recently, the developments in electronic apparatuses, and the minimization of the size and the weight of such apparatuses have been advancing rapidly. These developments are based on the miniaturization and the enhancement of reliability in semiconductor devices. The application of these semiconductor devices to a semiconductor power device has increased with the increase of the blocking voltage and the current in transistors, and the applications of these transistors to a semiconductor power module which requires the minimization of size and weight are widely conducted.

FIG. 1 shows a circuit diagram of a well-known three-phase inverter bridge using transistors. The portions shown in heavy lines constitute a main circuit portion through which a large current must flow. The reference characters Q1 to Q6 designate power transistors, and the reference characters B1 to B6 designate base input terminals of the power transistors Q1 to Q6. The reference characters P and N designate a positive and a negative DC terminal, respectively. The reference characters U, V, and W designate AC output terminals connected to the terminals of the three-phase AC motor, respectively.

A small capacity device among the semiconductor devices having the circuit construction shown in FIG. 1 is described in the following as a first prior art device:

In this device the wiring is conducted by using a metal conductivity layer printed by gilding or vapor plating on the surface of a print circuit board or an alumina circuit board, thereby resulting in high integration and the minimization or the size and the weight. However, at present the metal conductivity layer is only realized as having a thickness of several microns to several tens of microns, and accordingly, the cross sectional area of the conductivity layer is within a range of 5 $\mu m^2$ to 0.1 $mm^2$ caused by the pattern dimension in practical use, thereby resulting in a maximum allowable limit of 5 to 6 amperes as the current capacity of the wiring.

Accordingly, in a semiconductor power module whose current capacity exceeds 10 amperes, the wiring is conducted as in a manner of the second prior art device shown in FIGS. 2 and 3:

The reference numeral 1 designates a radiating metal base plate, the reference numeral 2 designates an alumina insulating substrate fixed onto the radiating metal base plate 1. The numerals 3a and 3b designate semiconductor power elements. The numerals 5 and 6 designate a base and an emitter input signal terminal. The numerals 7 and 8 designate a positive and a negative DC terminal. The numerals 9a to 9c designate AC terminals. The numerals 10a to 10c designate emitter internal electrodes. The numerals 11a to 11c designate collector internal electrodes. The semiconductor element 3b corresponding to the transistors Q2, Q4, Q6 in FIG. 1 and the emitter internal electrodes 10a to 10c are connected with each other by a fat aluminum wire (300 $\mu m\phi$ to 400 $\mu m\phi$) by supersonic wire-bonding, and the semiconductor element 3a corresponding to the transistors Q1, Q3, Q5 in FIG. 1 and the collector internal electrodes 11a to 11c are also connected with each other by a fat aluminum wire 4 by supersonic wire-bonding.

FIG. 3 shows an enlarged view of the construction around the connecting portion of the positive DC terminal 7. The collector internal electrodes 11a to 11c of the semiconductor element 3a corresponding to the transistors Q1, Q3, Q5 in FIG. 1 are soldered to the external electrode of the positive DC terminal 7 through a common metal plate 15.

In such a second prior art semiconductor device, it is required to provide the common metal plate 15 (the one for the DC terminal 8 is not shown) for connecting the collector, emitter internal electrodes 11a to 11c, 10a to 10c of the semiconductor element 3a, 3b with together, respectively, in the wiring of the positive and negative DC terminal 7, 8 through which a large current flows, and furthermore, it is required to connect the common metal plate 15 with the collector, emitter internal electrode 11a to 1c, 10a to 10c by soldering or the like. Therefore, the structure of the semiconductor power device having a medium sized capacity exceeding 10 amperes becomes complicated, and it takes a long time for the wiring in assembling as well as becoming an obstacle to the minimization of the size and the weight.

OBJECTS AND SUMMARY OF THE INVENTION

The present invention is directed to solving the problems pointed out above with respect to the prior art device, and has for its object to provide a semiconductor device capable of enhancing the assembly efficiency and minimizing the size and the weight of the device.

Another object of the present invention is to provide a semiconductor device capable of increasing the allowable current capacity of the conductivity layer by pattern wiring.

Yet another object of the present invention is to provide a semiconductor device capable of avoiding the use of a common metal electrode for connecting the internal electrodes of the semiconductor power element.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, there is provided a semiconductor device, which comprises: an insulating substrate; a semiconductor element for supplying or cutting off an electric power, the element being mounted on the substrate; an electric power terminal mounted on the substrate; a conductivity layer for connecting the semiconductor element and the electric power terminal, the layer being pattern wired on the substrate by gilding or vapor-plating; and a conductor provided on the conductivity layer.

BRIEF DESCRIPTION OF THE DRAWINGS

FIG. 5(a) and (b) are cross-sectional views showing the radiating insulating substrate and the metal wire of the device of FIG. 4, respectively.

DETAILED DESCRIPTION OF THE PREFERRED EMBODIMENTS

Figure 1:
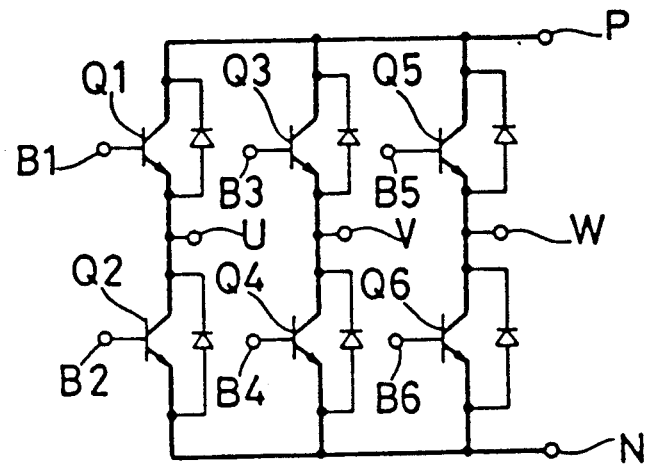
FIG. 1 is a circuit diagram showing a three-phase inverter bridge common to the prior art device and the present invention.
Figure 2:
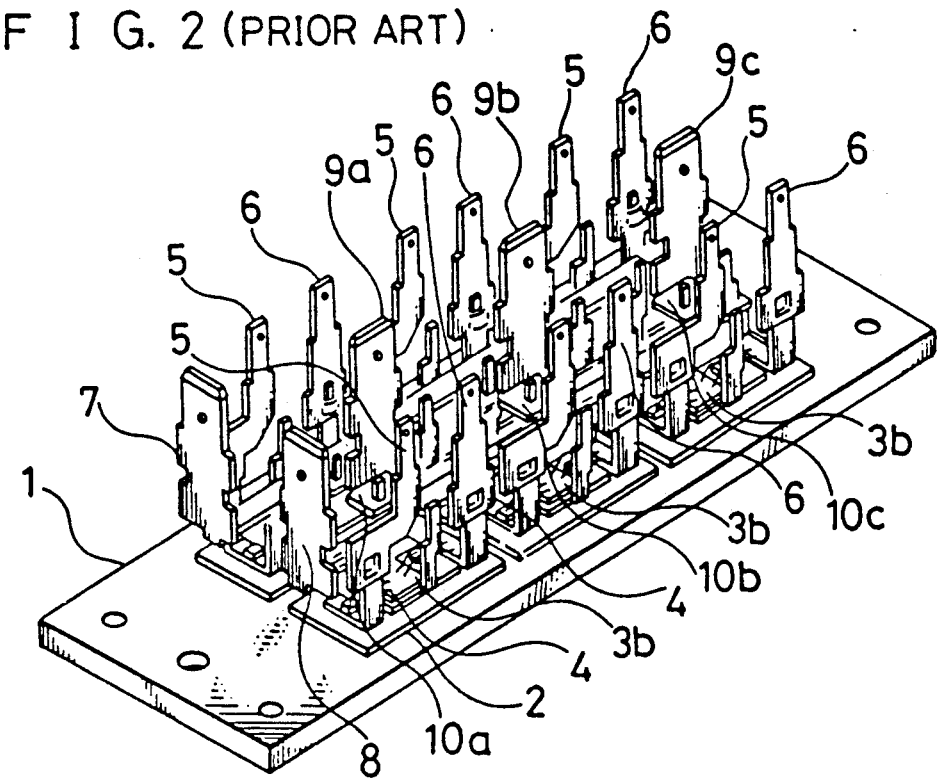
FIG. 2 is a perspective view showing the internal structure of the prior art semiconductor device.
Figure 3:
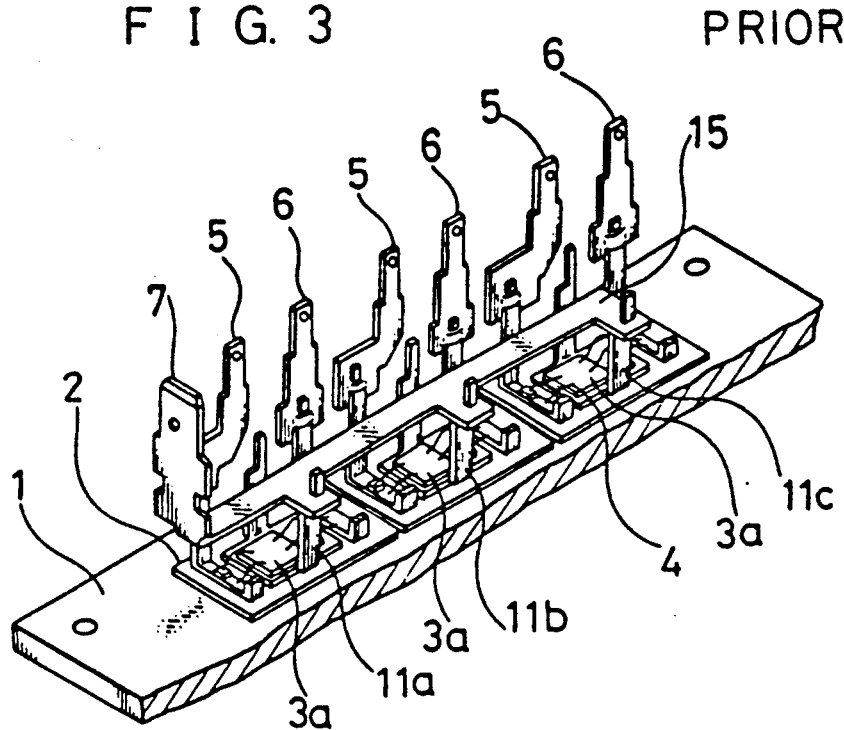
FIG. 3 is an enlarged perspective view of a main portion showing the structure of the connecting portion of the positive DC terminal and the internal electrodes of the device in FIG. 2.
Figure 4:
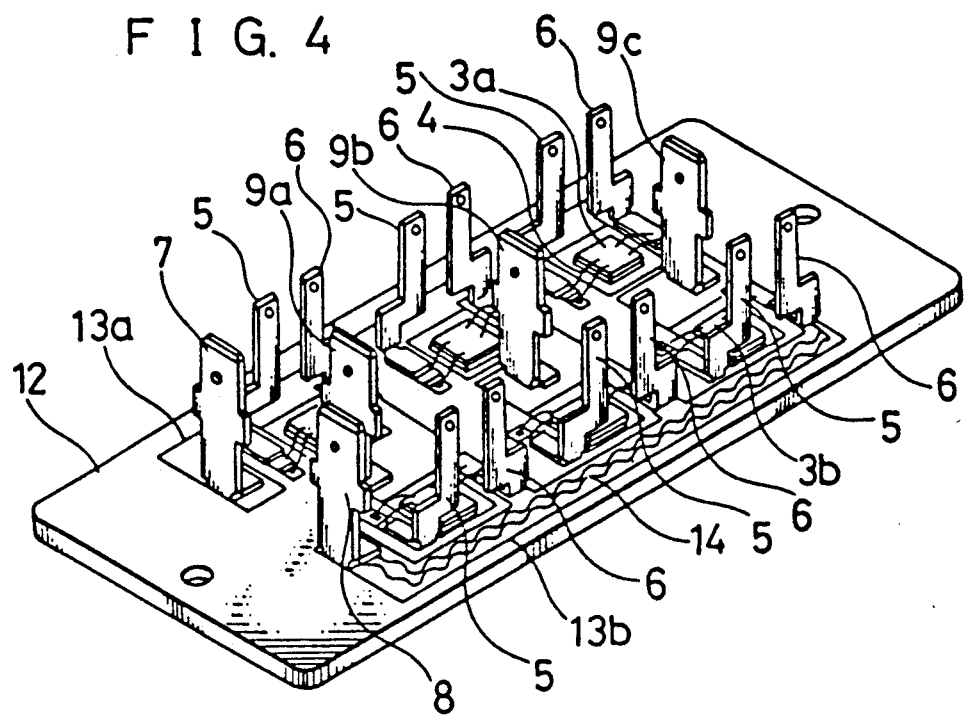
FIG. 4 is a perspective view showing the internal structure of the semiconductor device as one embodiment of the invention.

In order to explain the present invention in detail, reference will be more particularly made to FIGS. 4 and 5 which show the power transistor module of one embodiment of the present invention having a medium sized capacity (10 to 30 amperes).

The reference numeral 12 designates a heat sink having an upper portion that is insulated, also referred to as an insulating radiating substrate, on which pattern wirings are formed. The reference numerals 3a, 3b designate a semiconductor power element mounted on the surface of the radiating substrate 12 where the pattern wirings are formed. The numeral 4 designates a flat aluminum wiring which connects the respective semiconductor power element 3a, 3b and the respective electrode by supersonic wire-bonding. The numeral 5 designates a base input signal terminal. The numeral 6 designates an emitter input signal terminal. The numeral 7 designates a positive DC terminal. The numeral 8 designates an negative DC terminal. The numeral 9a to 9c designate AC terminals connected to the respective terminal of the three-phase AC motor.

The insulating radiating substrate 12 is shown in FIG. 5(a) in greater detail. The reference numeral 20 designates an aluminum plate. Other than the aluminum plate, an alumina plate or a beryllium plate is used. The numeral 21 designates an insulating film of thickness t=80 μm, consisting of an epoxy group resin. The numeral 22 designates a copper film, and the numeral 23 designates an aluminum film constituting the conductivity layers by pattern wirings.

The reference numerals 13a and 13b designate conductivity layers by pattern wirings which connect the collector and emitter internal electrodes with the positive and negative DC terminals 7 and 8, respectively. The power terminals 7 and 8 are soldered onto the substrate 12. The numeral 14 designates an aluminum wire of 300 to 600 μmφ as a metal conductor which is supersonic wire-bonded onto the conductivity layers 13a and 13b so as to increase the allowable current capacity of the conductivity layers 13a and 13b.

The detailed construction of the conductivity layers 13a, 13b is shown in FIG. 5(b). These conductivity layers may be formed on the insulating substrate by gilding or vapor-plating. The copper film 22 has a thickness of 35 μm, and the aluminum film 23 has a thickness of 40 μm. The wire 14 can be made of pure aluminum or aluminum including silicon in a percent of 0.1% to 0.5%. Two aluminum wires 14 of 300 to 600 μmφ are wire-bonded in FIG. 4, and this number "2" is an appropriate one for a semiconductor power device of 10 to 30 amperes.

In the above-illustrated embodiment a flat aluminum wire 14 is supersonic wire-bonded onto the conductivity layers 13a and 13b by pattern-wired metal film through which a large current flows, thereby making it possible to alleviate the need for common metal electrode plate which connects the collector and emitter internal electrodes to the DC terminals. As a result, it is possible to simplify the structure of the semiconductor power device having a medium sized capacity as well as to simplify the assembling. Furthermore, it is possible to minimize the size and the weight.

In the illustrated embodiment an aluminum wire 14 as a metal conductor is wire-bonded onto the conductivity layers 13a and 13b, but a metal plate such as a copper plate having Ni plating can be fixed onto the conductivity layers by soldering or the like with the same effects. Any conductive plate which can be subjected to soldering can be used instead of the copper plate.

What is claimed is:

1. A semiconductor device, which comprises:
   an insulating substrate;
   a semiconductor power element mounted on said insulating substrate for supplying or cutting off electric power;
   an electric power terminal mounted on said insulating substrate;
   gilded or por-plated electrical conductivity pattern wiring provided on said insulating substrate for connecting said semiconductor power element and said electric power terminal; and
   an electrical conductor provided on said electrical conductivity pattern wiring so as to increase electrical current capacity between said semiconductor power element and said electric power terminal.

2. The semiconductor device as device as defined in claim 1, wherein said electrical conductor comprises a metal conducting wire which is wire-bonded onto said electrical conductivity pattern wiring.

3. The semiconductor device as defined in claim 1, wherein said electrical conductor comprises a metal conducting plate which is fixed onto said electrical conductivity pattern wiring.

4. The semiconductor device as defined in claim 2, wherein said metal conducting wire is aluminum or an aluminum alloy.

5. The semiconductor device as defined in claim 3, wherein said metal conducting plate is a copper plate having nickel plating.

6. The semiconductor device as defined in claim 1, wherein said electrical conductivity pattern wiring is formed from first and second metal films.

7. The semiconductor device as defined in claim 1, wherein said electrical conductivity pattern wiring is formed from an aluminum film provided on a copper film.

8. The semiconductor device as defined in claim 1, wherein said insulating substrate comprises an insulation film provided on a metal base plate.

9. The semiconductor device as defined in claim 8, wherein said insulation film is an epoxy resin and wherein said metal base plate is selected from the group consisting of aluminum, alumina, and beryllium.

10. The semiconductor device as defined in claim 2, wherein said metal conducting wire is formed from aluminum or an aluminum-silicon alloy and wherein said metal conducting wire has a thickness of from 300 to 600 microns.

11. The semiconductor device as defined in claim 10, wherein said electrical conductivity pattern wiring is formed from an aluminum film provided on a copper film, said aluminum film having a thickness of about 35 microns and said copper film having a thickness of about 40 microns.

12. The semiconductor device as defined in claim 1, wherein said electrical conductor comprises at least two metal conducting wires which are wire-bonded onto said electrical conductivity layer.

13. The semiconductor device as defined in claim 1, wherein said semiconductor device has a capacity of from 10 to 30 amperes.

* * * * *